United States Patent
Kitamura et al.

(10) Patent No.: US 8,957,307 B2
(45) Date of Patent: Feb. 17, 2015

(54) PHOTOELECTRIC CONVERSION ELEMENT MODULE AND METHOD FOR MANUFACTURING PHOTOELECTRIC CONVERSION ELEMENT MODULE

(75) Inventors: Takayuki Kitamura, Chiba (JP); Hiroki Usui, Chiba (JP)

(73) Assignee: Fujikura Ltd., Tokyo (JP)

( * ) Notice: Subject to any disclaimer, the term of this patent is extended or adjusted under 35 U.S.C. 154(b) by 121 days.

(21) Appl. No.: 12/955,547

(22) Filed: Nov. 29, 2010

(65) Prior Publication Data
US 2011/0126879 A1 Jun. 2, 2011

Related U.S. Application Data

(63) Continuation of application No. PCT/JP2009/002378, filed on May 29, 2009.

(30) Foreign Application Priority Data

May 30, 2008 (JP) .................... 2008-143712

(51) Int. Cl.
*H01L 31/00* (2006.01)
*H01M 14/00* (2006.01)
(Continued)

(52) U.S. Cl.
CPC ........... *H01M 14/005* (2013.01); *H01G 9/2081* (2013.01); *H01G 9/2031* (2013.01); *H01G 9/2059* (2013.01); *H01L 31/022425* (2013.01); *Y02E 10/542* (2013.01)
USPC ........................................................ 136/256

(58) Field of Classification Search
CPC .................... H01L 51/5246; H01L 2924/163; H01L 2924/173; H01L 2924/183
USPC ........................................................ 136/256
See application file for complete search history.

(56) References Cited

U.S. PATENT DOCUMENTS 5,259,891 A * 11/1993 Matsuyama et al. .......... 136/244
5,735,966 A * 4/1998 Luch ............................ 136/244
(Continued)

FOREIGN PATENT DOCUMENTS

| CN | 101361218 A | 2/2009 |
|---|---|---|
| EP | 1 976 051 A1 | 10/2008 |
| JP | 2006244954 A * | 9/2006 |
| JP | 2007-280906 A | 10/2007 |
| WO | 2007/083461 A1 | 7/2007 |
| WO | WO 2007083461 A1 * | 7/2007 |

OTHER PUBLICATIONS

Machine translation of Nagatsuka (JP 2006244954), retrieved Jul. 20, 2012.*

(Continued)

*Primary Examiner* — Shannon Gardner
(74) *Attorney, Agent, or Firm* — Sughrue Mion, PLLC

(57) ABSTRACT

A photoelectric conversion element module 1 comprises a plurality of photoelectric conversion elements 10 each having a first electrode 15 and a second electrode 25 that oppose each other, and a conductive member 30 electrically connecting the plurality of photoelectric conversion elements 10 to each other; the plurality of photoelectric conversion elements 10 are arranged in planar form such that directions from the first electrodes 15 toward the second electrodes 25 are the same; the first electrode 15 and second electrode 25 have extended portions 15a, 25a respectively which extend to outside a region encompassed by an outer periphery of a sealing member 17; and in adjacent photoelectric conversion elements 10A and 10B, the conductive member 30 connects the extended portion 15a of one of the photoelectric conversion elements 10A and the extended portion 25a of the other photoelectric conversion element 10B; and the extended portion 25a has flexibility.

5 Claims, 13 Drawing Sheets

(51) Int. Cl.
*H01G 9/20* (2006.01)
*H01L 31/0224* (2006.01)

(56) References Cited

U.S. PATENT DOCUMENTS

| | | | |
|---|---|---|---|
| 2001/0027806 A1* | 10/2001 | Yamanaka et al. | 136/263 |
| 2004/0118444 A1 | 6/2004 | Duggal et al. | |
| 2007/0089784 A1* | 4/2007 | Noh et al. | 136/263 |
| 2007/0295381 A1* | 12/2007 | Fujii et al. | 136/244 |
| 2009/0272433 A1 | 11/2009 | Morooka et al. | |
| 2010/0012166 A1 | 1/2010 | Yamanaka et al. | |

OTHER PUBLICATIONS

Search Report in corresponding EP 09754457.1 dated Sep. 13, 2012.

Office Action in corresponding Japanese Patent Application No. 2010-514380 dated Apr. 5, 2013.

Chinese Office Action issued Dec. 4, 2012 in Chinese Patent Application No. 200980120323.1.

European Office Action issued Sep. 23, 2014 in European Patent Application No. 09 754 457.1.

* cited by examiner

F I G. 1
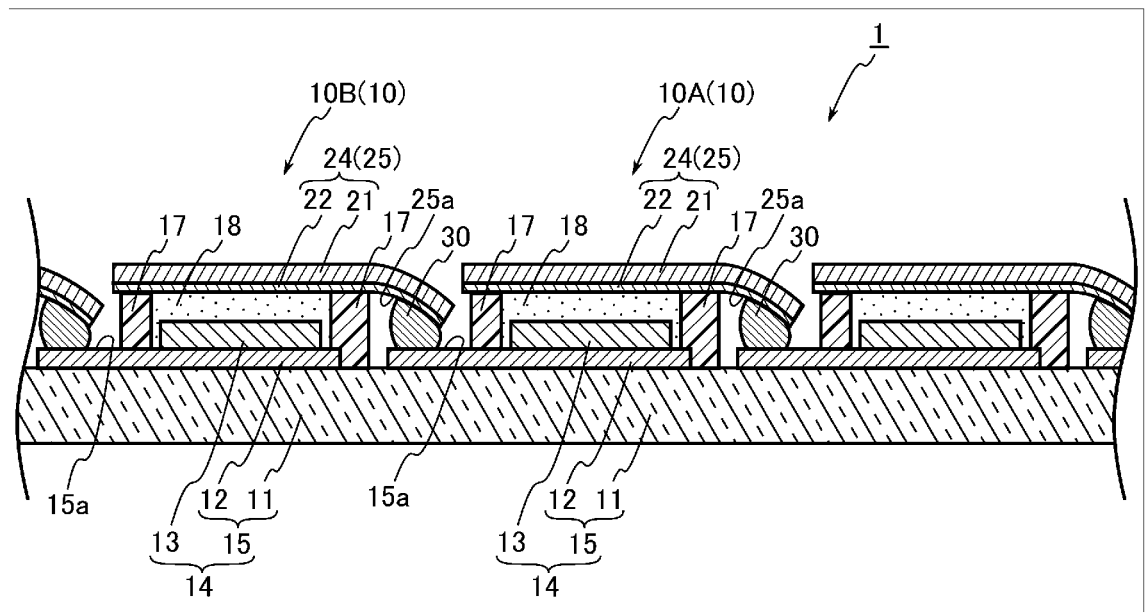

F I G. 1 0
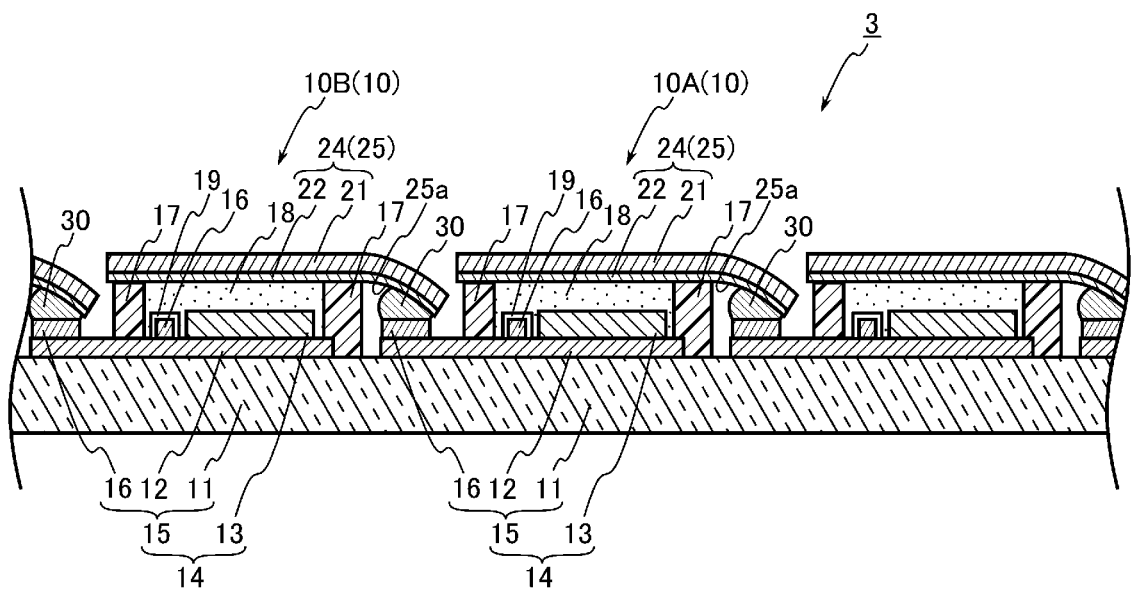

PHOTOELECTRIC CONVERSION ELEMENT MODULE AND METHOD FOR MANUFACTURING PHOTOELECTRIC CONVERSION ELEMENT MODULE

CROSS REFERENCE TO RELATED APPLICATIONS

This application is a Continuation of National Stage of International Application No. PCT/JP2009/002378 filed May 29, 2009, claiming priority based on Japanese Patent Application No. 2008-143712 filed May 30, 2008, the contents of all of which are incorporated herein by reference in their entirety.

TECHNICAL FIELD

This invention relates to a dye-sensitized photoelectric conversion element module, and to a method for manufacturing a photoelectric conversion element module.

BACKGROUND ART

At present, in the light of environmental problems, resource problems and similar, solar cells as a source of clean energy are attracting attention. Silicon system solar cells are known as one type of solar cell; as silicon system solar cells there are ones which use single crystals, polycrystals, amorphous silicon, or similar. However, in silicon system solar cells generally problems such as high manufacturing costs, and moreover inadequate supply of raw materials remain, and so widespread adoption has not been achieved.

Further, compound system solar cells such as Cu—In—Se system (also called CIS system) have been developed, and have excellent characteristics such as extremely high photoelectric conversion efficiencies; but compound system solar cells have problems such as manufacturing costs, environmental burdens and similar, hence again widespread adoption has not been achieved.

In contrast to these solar cells, dye-sensitized solar cells have been proposed by a group led by Grätzel of Switzerland and others, and are attracting attention as photoelectric conversion elements which are inexpensive and capable of obtaining high photoelectric conversion efficiencies.

In order to increase the area of a solar cell, it is sufficient to reduce the current which generates to the extent possible and raise the voltage so as to suppress declines in voltage occurring due to the resistance within the photoelectric conversion element or in outside circuits. To do so, application of a series-connected type module construction is effective. In dye-sensitized solar cells, so-called W-type and Z-type series-connected module constructions, named for the shapes of the current paths, have been proposed (see Patent Reference 1).

FIG. 12 and FIG. 13 are diagrams showing the constructions in cross-section of such photoelectric conversion elements of the prior art. As shown in FIG. 12 and FIG. 13 respectively, in what are called W-type and Z-type photoelectric conversion element modules, the working electrodes (window-side electrodes) 108 are formed from a base material 101, transparent conductive layer 102, and semiconductor layer 103; light is incident on the working electrodes. On the other hand, the counter electrodes 109 are formed from a base material 101, transparent conductive layer 102, and catalyst layer 104. And, each of the photoelectric conversion elements of the module is constructed with an electrolyte layer (electrolytic solution or electrolyte gel) 105 sandwiched between the working electrode 108 and the counter electrode 109.

And, a W-type photoelectric conversion element module 100A can receive light from the rear surface by arranging each of the photoelectric conversion elements 110a, 100b, 100c, . . . , divided by partition walls 106, such that the working electrode 108 and the counter electrode 109 alternate between adjacent photoelectric conversion elements, as shown in FIG. 12. Further, the photoelectric conversion element module 100A has a construction in which the working electrodes 108 and counter electrodes 109 of pairs of adjacent photoelectric conversion elements 110a, 110b (110b, 110c) are provided on the same substrate 101 and interconnected.

On the other hand, in a Z-type photoelectric conversion element module 100B, photoelectric conversion elements 110a, 100b, 100c, . . . divided by partition walls 106, are arranged such that working electrodes 108 are placed on one side of the photoelectric conversion element module 100B, and counter electrodes 109 are placed on the other side, as shown in FIG. 13. And, the working electrodes 108 and counter electrodes 109 of these adjacent photoelectric conversion elements 110a, 100b, 100c, . . . have a construction in which the working electrodes 108 and counter electrodes 109 are joined and electrically connected by connection members 107.

However, in a W-type photoelectric conversion element module 100A, a construction is employed in which adjacent photoelectric conversion elements are interconnected in alteration on the front and on the rear, and the construction is extremely simple, but because half the cells receive light from the rear-face side, improvement of the conversion efficiency is difficult.

On the other hand, in a Z-type photoelectric conversion element module 100B, a construction is employed in which all photoelectric conversion elements face in the same direction, but it is necessary to connect the opposing electrodes between adjacent photoelectric conversion elements (the working electrode of one cell and the counter electrode of an adjacent cell), and there is a tendency for the manufacture of photoelectric conversion element modules to become troublesome. Moreover, control of distances between electrodes must be made uniform for elements over large areas, and a high degree of machining precision is required.

In Patent Reference 2 below, such a Z-type photoelectric conversion element module is described. In a photoelectric conversion element module described in Patent Reference 2, working electrodes are provided on base material used in common by the photoelectric conversion elements, and counter electrodes are provided on base material used in common by the photoelectric conversion elements. And, the working electrodes and counter electrodes are opposed, and the base material on which working electrodes are provided is bonded together with the base material on which counter electrodes are provided with a prescribed interval spaced. At this time, working electrodes and counter electrodes of adjacent photoelectric conversion elements are electrically connected using a conductive paste, to obtain a photoelectric conversion element module in which photoelectric conversion elements are electrically connected together.

BACKGROUND ART DOCUMENT

Patent Document

Patent Reference 1: Japanese Patent Laid-open No. 8-306399
Patent Reference 2: Japanese Patent Laid-open No. 2007-220606

SUMMARY OF THE INVENTION

Problem to be Solved by the Invention

However, in the photoelectric conversion element module described in Patent Reference 2 above, the working electrodes and counter electrodes provided on the base materials are connected by conductive paste. Consequently when the conductive paste is hardened, if shrinkage or similar of the conductive paste occurs, stresses in the direction toward which the working electrodes and counter electrodes approach may occur. In such cases, cracks may occur in the conductive paste due to these stresses, or cracks may occur between the conductive paste and the working electrodes or the counter electrodes. Further, when external forces are applied to the photoelectric conversion element module, and stresses occur between the conductive paste and the working electrodes or counter electrodes as a result, cracks may occur in the conductive paste, or cracks may occur between the conductive paste and the working electrodes or the counter electrodes. In such cases, problems may occur in electrical connections between photoelectric conversion elements.

Hence an object of this invention is to provide a photoelectric conversion element module which can enhance the reliability of electrical connections between photoelectric conversion elements, as well as a method for manufacturing a photoelectric conversion element module.

Means for Solving the Problems

A photoelectric conversion element module of this invention is a photoelectric conversion element module comprising a plurality of photoelectric conversion elements each having a first electrode and a second electrode that oppose each other, and a sealing member connected to the first electrode and the second electrode, and a conductive member electrically connecting the plurality of photoelectric conversion elements to each other, the plurality of photoelectric conversion elements being arranged in planar form such that directions from the first electrodes toward the second electrodes are the same, and the photoelectric conversion element module is characterized in that: the first electrode and the second electrode each have an extended portion which, when viewing the first electrode and the second electrode along a direction connecting the first electrode and the second electrode, extends to outside a region encompassed by an outer periphery of the sealing member; and in adjacent photoelectric conversion elements, the conductive member connects the extended portion of the first electrode of one of the photoelectric conversion elements and the extended portion of the second electrode of the other photoelectric conversion element; and at least one of the extended portion of the first electrode and the extended portion of the second electrode has flexibility.

According to such a photoelectric conversion element module, in adjacent photoelectric conversion elements, the extended portion of the first electrode of one photoelectric conversion element and the extended portion of the second electrode of the other photoelectric conversion element are connected by a conductive member, and at least one of the interconnected extended portion of the first electrode and extended portion of the second electrode has flexibility. Hence when an external force is applied and a stress is applied between the conductive member and the first electrode or the second electrode, or when the conductive member is deformed during aging and a stress is applied between the conductive member and the first electrode or the second electrode, due to flexing of the extended portion having flexibility, the stress is absorbed. By this absorption of stress by an extended portion having flexibility, breakage between a conductive member and a first electrode or a second electrode or similar is suppressed. Hence the reliability of electrical connection between photoelectric conversion elements can be enhanced.

Further, in the above photoelectric conversion element module, it is preferable that among the first electrode and the second electrode, the extended portion of one electrode have flexibility, and the other electrode have an insulating base material on the side opposite the one electrode, and that the base materials in the plurality of photoelectric conversion elements be formed integrally with each other.

According to such a photoelectric conversion element module, the plurality of photoelectric conversion elements are formed integrally with each other through the base materials. Hence changes in the relative positions of adjacent photoelectric conversion elements are suppressed. Consequently stresses applied between a first electrode and second electrode and the conductive member are suppressed, and the reliability of connection between photoelectric conversion elements can be further enhanced.

Further, in the above photoelectric conversion element module, it is preferable that the extended portion of the one electrode be flexed toward the side of the other electrode.

According to such a photoelectric conversion element module, the extended portion of one electrode is flexed toward the side of the other electrode and connected to the conductive member, so that even when the conductive member is connected in a state of protrusion on the side opposite the side of the other electrode at the extended portion of the one electrode, the thickness of the photoelectric conversion element module can be suppressed. Further, because the extended portion of one electrode is flexed on the side of the other electrode, stress pressing against the side of the other electrode is imparted to the one electrode. Hence the one electrode and the sealing member are more firmly connected, and the photoelectric conversion element module can have excellent durability.

Further, in the above photoelectric conversion element module, it is preferable that the first electrode have a transparent conductive film and a current collector wire provided on the transparent conductive film from a region encompassed by the sealing member to the extended portion, and that the conductive member be connected with the current collector wire in the extended portion of the first electrode.

According to such a photoelectric conversion element module, the resistance of the first electrode can be reduced by the current collector wire. And, by connection of the conductive member and the current collector wire, the connection resistance of the conductive member and the first electrode can be reduced. Hence the efficiency of the photoelectric conversion element module can be enhanced.

Further, in the above photoelectric conversion element module, it is preferable that the conductive member be either conductive paste or solder.

And, in the above photoelectric conversion element module, it is preferable that the conductive member be conductive paste, and that the current collector wire and the conductive paste contain the same material.

According to such a photoelectric conversion element module, the connectivity of the current collector wire with the conductive member is excellent, so that electrical connection between photoelectric conversion elements is still more excellent.

Further, a method for manufacturing a photoelectric conversion element module of this invention is a method for manufacturing a photoelectric conversion element module comprising a preparation process of preparing a plurality of photoelectric conversion elements each having a first electrode and a second electrode that oppose each other, and a sealing member connected to the first electrode and the second electrode, the plurality of photoelectric conversion elements being prepared so as to be arranged in planar form such that directions from the first electrodes toward the second electrodes are the same, and a connection process of electrically connecting the plurality of photoelectric conversion elements to each other by a conductive member; and the method is characterized in that: the first electrode and the second electrode each have an extended portion which, when viewing the first electrode and the second electrode along a direction connecting the first electrode and the second electrode, extends to outside a region encompassed by an outer periphery of the sealing member; and in the connection process, in adjacent photoelectric conversion elements, the extended portion of the first electrode of one of the photoelectric conversion elements is connected with the extended portion of the second electrode of the other photoelectric conversion element by the conductive member, and at least one of the extended portion of the first electrode and the extended portion of the second electrode has flexibility.

According to such a method for manufacturing a photoelectric conversion element module, in the connection process, the extended portion of the first electrode of one photoelectric conversion element and the extended portion of the second electrode of the other photoelectric conversion element of adjacent photoelectric conversion elements are connected by the conductive member. At this time, at least one of the extended portion of the first electrode and the extended portion of the second electrode has flexibility, and so the extended portion having flexibility can flex. Hence in the connection process, even when the conductive member is deformed, the extended portion having flexibility flexes so as to follow the deformation of the conductive member, and the deformation of the conductive member can be absorbed by the extended portion having flexibility. In this way a photoelectric conversion element module can be manufactured such that the conductive member and electrodes can be connected appropriately, with high reliability of the electrical connection between photoelectric conversion elements.

Further, in the above method for manufacturing a photoelectric conversion element module, it is preferable that in the connection process, the extended portion of the first electrode and the extended portion of the second electrode be connected with the conductive member, while applying force to the extended portion having flexibility so as to cause the extended portion of the first electrode and the extended portion of the second electrode to approach each other.

According to such a method for manufacturing a photoelectric conversion element module, even when the conductive member is deformed, by applying force such that the extended portion of the first electrode and the extended portion of the second electrode approach each other, the extended portion having flexibility can appropriately follow the deformation of the conductive member. Hence a photoelectric conversion element module can be manufactured with higher reliability of the electrical connection between photoelectric conversion elements.

Effects of the Invention

According to this invention, a photoelectric conversion element module with satisfactory electrical connection between photoelectric conversion elements, as well as a method for manufacturing a photoelectric conversion element module, are provided.

BRIEF DESCRIPTION OF THE DRAWINGS

FIG. 1 is a cross-sectional view showing the construction in a cross-section of a photoelectric conversion element module of a first embodiment of the invention;

FIG. 10 is a cross-sectional view showing the construction in a cross-section of the photoelectric conversion element module of a third embodiment of the invention;

MODE FOR CARRYING OUT THE INVENTION

Figure 2:
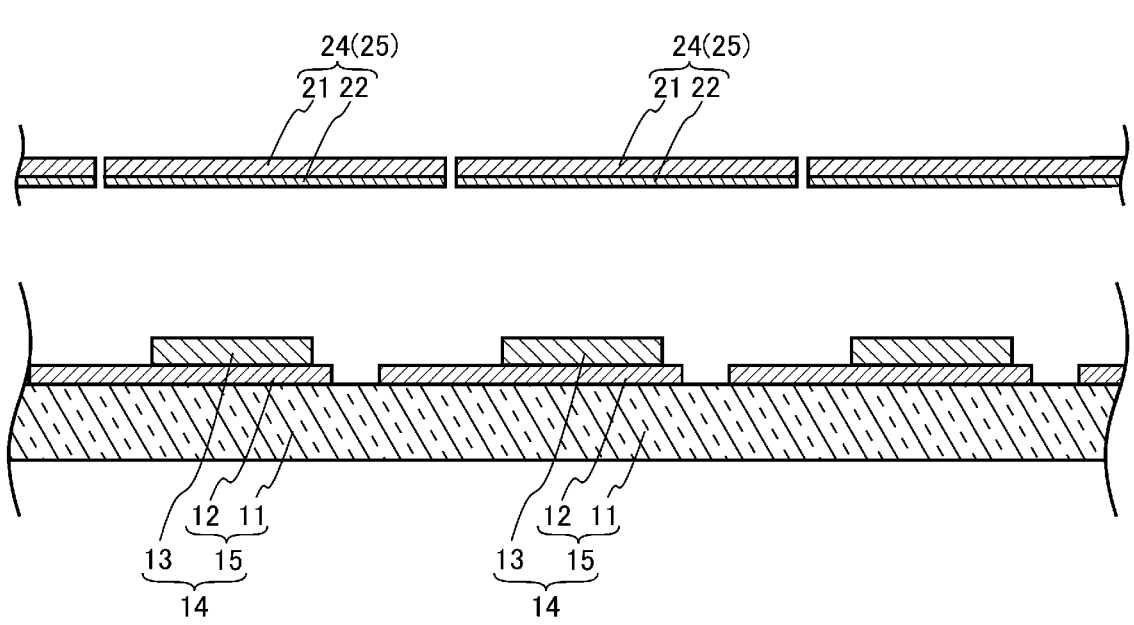
FIG. 2 is a cross-sectional view showing the appearance of a cross-section in a preparation process of a method for manufacturing a photoelectric conversion element module.

Below, preferred embodiments of a photoelectric conversion element module of the invention are explained in detail based on the drawings.

First Embodiment

FIG. 1 is a cross-sectional view showing the construction in a cross-section of a photoelectric conversion element module of a first embodiment of the invention.

As shown in FIG. 1, the photoelectric conversion element module 1 principally comprises a plurality of photoelectric conversion elements 10 (10A, 10B, . . . ) arranged in planar form, and a conductive member 30 which electrically connects together the plurality of photoelectric conversion elements 10 (10A, 10B, . . . ).

First, because each of the plurality of photoelectric conversion elements 10 (10A, 10B, . . . ) is configured similarly, a single photoelectric conversion element 10 is explained.

The photoelectric conversion element 10 principally comprises a working electrode 14, counter electrode 24 arranged opposing the working electrode 14, electrolyte 18 arranged between the working electrode 14 and the counter electrode 24, and sealing member 17 which encompasses and seals the electrolyte 18.

(Working Electrode)

The working electrode 14 comprises a first electrode 15 formed from an insulating transparent plate-shape base material 11 and a transparent conductive film 12 provided on one surface of the base material 11, and a porous oxide semiconductor layer 13 provided on the transparent conductive film 12 on the side opposite the side of the base material 11, at least a portion of which carries a sensitizing dye. In this embodiment, the working electrode 14, if having optical transmissivity, may or may not have flexibility.

The plate-shape base materials 11 are integrally formed with each other of the plurality of photoelectric conversion elements 10 (10A, 10B, . . . ) arranged in planar form.

The base material 11 comprises a transparent material. As such a transparent material, no limitations in particular are imposed so long as the material has optical transmissivity; for example, glass, polyethylene terephthalate, polycarbonate, polyester sulfone, or similar normally used as transparent base materials in photoelectric conversion elements 10 can be used. The base material 11 is selected appropriately taking into consideration from among these, taking into consideration resistance to the electrolyte and similar. Further, it is preferable that the base material 11 be formed from a material which to the extent possible has excellent optical transmissivity, and it is still more preferable that the material have a transmissivity of 90% or higher.

The transparent conductive film 12 is formed from a thin film formed on one surface of the base material 11. The transparent conductive film 12 is formed such that transparent conductive films 12 are mutually separated in each of the photoelectric conversion elements 10 (10A, 10B, . . . ).

Further, it is preferable that the transparent conductive film 12 be a thin film comprising a conductive metal oxide, in order to obtain a construction which does not significantly detract from transparency and conductivity. As the conductive metal oxide used to form such a transparent conductive film 12, no limitations in particular are imposed, but for example tin-added indium oxide (ITO), fluorine-added tin oxide (FTO), tin oxide ($SnO_2$), or similar may be used. Of these, a single-layer film comprising only FTO, or a laminat film obtained by laminating a film of FTO on a film of ITO, have minimal amounts of light absorbed in the visible range, high conductivity, and excellent heat resistance, and so are preferable.

The porous oxide semiconductor layer 13 is provided on the surface of the transparent conductive film 12 on the side opposite the side of the base material 11; the surface carries a sensitizing dye. As the oxide semiconductor used to form the porous oxide semiconductor layer 13, no limitations in particular are imposed, but any oxide semiconductor normally used to form a porous oxide semiconductor layer for a photoelectric conversion element can be used. Such oxide semiconductors include for example titanium oxide ($TiO_2$), tin oxide ($SnO_2$), zinc oxide (ZnO), niobium oxide ($Nb_2O_5$), tungsten oxide ($WO_3$), and similar; two or more types of these may be comprised.

It is preferable that the average particle diameter of particles of these oxide semiconductors be from 1 to 1000 nm, since the surface area of the oxide semiconductors covered with sensitizing dye is increased, that is, sites for photoconversion are broadened, and more electrons can be generated. Further, it is preferable that the porous oxide semiconductor 13 be formed by layering oxide semiconductor particles with different particle size distributions. In this case, repeated reflection of light within the semiconductor layer can be induced, incident light which escapes to outside the porous oxide semiconductor layer 13 can be reduced, and light can be efficiently converted into electrons. The thickness of the porous oxide semiconductor layer 13 may for example be from 0.5 to 50 μm. The porous oxide semiconductor layer 13 can also be formed using a layered member of a plurality of oxide semiconductors of different materials.

As the method of forming the porous oxide semiconductor layer 13, there may be used a method including for example adding a desired additive as necessary to either a dispersion liquid in which fine particles of a commercially marketed oxide semiconductor are dispersed in a desired dispersing medium, or to a colloid solution which can be prepared using a sol-gel method; applying the dispersion liquid or the colloid solution by well-known application method such as a screen printing method, an inkjet printing method, a roll coating method, a doctor blade method, a spray application method, or similar; and sintering the dispersion liquid or the colloid solution.

As the sensitizing dye, in addition to ruthenium complexes containing a bipyridine structure, terpyridine structure or similar as ligands, metal-containing complexes such as porphyrin, phthalocyanine or similar, organic dyes such as eosine, rhodamine, merocyanine, or similar can be employed; a dye which exhibits excitation behavior appropriate to the application and the semiconductor used may be selected.

(Electrolyte)

The electrolyte 18 is arranged in the vicinity of the porous oxide semiconductor layer 13 between the working electrode 14 and the counter electrode 24. As the electrolyte 18 either the one obtained by making an electrolytic solution impregnate the porous oxide semiconductor layer 13 or, the one obtained by making an electrolytic solution impregnate the porous oxide semiconductor layer 13, gelling (conversion into a pseudo-solid) of this electrolytic solution is performed using an appropriate gelling agent and forming the electrolyte integrally with the porous oxide semiconductor layer 13; or, a gel-form electrolyte comprising an ionic liquid, oxide semiconductor particles, and conductive particles, is used.

As the above electrolytic solution, the one obtained by dissolving electrolyte components such as iodine, iodide ions, tertiary butylpyridine, or similar in organic solvent such as ethylene carbonate, methoxy acetonitrile, or similar or ionic liquid are used. As the gelling agent used when gelling this electrolytic solution, polyvinylidene fluoride, a polyethylene oxide derivative, an amino acid derivative, or similar may be used.

As the above ionic liquid, no limitations in particular are imposed; materials which are liquid at room temperature, such as for example normal-temperature fused salts employing as cations a compound having quaternized nitrogen atoms, may be used. Examples of normal-temperature fused-salt cations include quaternized imidazolium derivatives, quaternized pyridinium derivatives, quaternized ammonium derivatives, and similar. Examples of normal-temperature fused-salt anions include $BF_4^-$, $PF_6^-$, $(HF)_n^-$, bis(trifluoromethylsulfonyl)imide $[N(CF_3SO_2)_2^-]$, iodide ions, and similar. Specific examples of ionic liquids include salts comprising quaternized imidazolium-system cations and iodide ions, bis (trifluoromethylsulfonyl)imide ions, or similar.

As the above oxide semiconductor particles, no limitations in particular are imposed on the material type, particle size or similar; examples include particles which have excellent miscibility with electrolytic solutions principally comprising ionic liquids, and turns such electrolytic solutions into a gel. Further, it is preferable that the oxide semiconductor particles do not reduce the semiconducting properties of the electrolyte, and have excellent chemical stability against other coexisting components contained in the electrolyte. In particular, even when the electrolyte includes redox couples such as iodine/iodide ions, bromine/bromide ions, or similar, it is preferable that the oxide semiconductor particles do not undergo degradation due to oxidation reactions.

Examples of such oxide semiconductor particles include one type, or a mixture of two or more types, selected from the group consisting of $TiO_2$, $SnO_2$, $SiO_2$, $ZnO$, $Nb_2O_5$, $In_2O_3$, $ZrO_2$, $Al_2O_3$, $WO_3$, $SrTiO_3$, $Ta_2O_5$, $La_2O_3$, $Y_2O_3$, $Ho_2O_3$, $Bi_2O_3$, and $CeO_2$; $TiO_2$ and $SiO_2$ are especially preferable. It is preferable that the average particle diameters of the $TiO_2$ and $SiO_2$ be approximately 2 nm to 1000 nm.

Further, as the above fine conductive particles, particles having conductivity, such as conductor or semiconductor or similar, are used. The range of the specific resistance of the conductive particles is preferably $1.0 \times 10^{-2} \Omega \cdot cm$ or lower, and still more preferably $1.0 \times 10^{-3} \Omega \cdot cm$ or lower. No limitations in particular are imposed on the types or particle sizes of the conductive particles, but particles which have excellent miscibility with electrolytic solutions principally comprising an ionic liquid, and turn this electrolytic solution into a gel are preferable. Further, it is preferable that the particles have excellent chemical stability against other coexisting components contained in the electrolyte. In particular, it is preferable that the conductive particles do not undergo degradation due to oxidation reactions even when the electrolyte includes redox couples such as iodine/iodide ions, bromine/bromide ions, or similar.

Examples of such fine conductive particles are particles of material principally comprising carbon; specifically, examples include particles such as carbon nanotubes, carbon fibers, carbon black and similar. Methods of manufacture of such materials are well-known, and commercial products can also be used.

(Counter Electrode)

The counter electrode 24 is provided opposing the working electrode 14, and is formed from a thin conductive plate 21 and a catalyst layer 22. In this embodiment, the counter electrode 24 is taken to be the second electrode 25.

Further, the counter electrode 24 has overall flexibility. In this embodiment, if the counter electrode 24 has flexibility, the counter electrode 24 may or may not have optical transmissivity.

As the material for the conductive plate 21 of this counter electrode 24, if it is a conductor having flexibility then no limitations in particular are imposed regardless of whether there is optical transmissivity or not; however, in the particular case in which the counter electrode 24 does not have optical transmissivity, for example metal such as titanium, nickel, platinum or similar, oxide conductors such as ITO, FTO, or similar, carbon or similar, may be used. In this case, the oxide conductor may be colored. Further, the conductive plate 21 may be configured with a thin film of an oxide conductor, carbon or similar provided on the surface of resin, glass or similar. Further, when the counter electrode 24 has optical transmissivity, the conductive plate 21 is for example configured by providing an insulating transparent base material and a transparent conductive film on the surface of this base material on the working electrode side. In this case, while no limitations in particular are imposed, the insulating transparent base material of the counter electrode 24 is for example configured from the same material as the base material 11 of the working electrode 14, and the transparent conductive film of the counter electrode 24 is for example configured similarly to the transparent conductive film 12 of the working electrode 14.

Further, the catalyst layer 22 is configured for example from carbon, platinum, or similar. When the conductive plate 21 is of platinum, a catalyst layer 22 may not be provided.

(Sealing Member)

The sealing member 17 is connected to the first electrode 15 of the working electrode 14 and the second electrode 25 which is the counter electrode 24, and encompasses and seals the electrolyte 18. It is preferable that this sealing member 17 be formed from material which has excellent adhesiveness to the working electrode 14 and counter electrode 24, and which has excellent sealing performance. Examples of such a material are for example ionomers, ethylene-vinyl acetate anhydride copolymers, ethylene-methacrylate copolymers, ethylene-vinyl alcohol copolymers, ultraviolet ray-cured resins, and vinyl alcohol polymers. Examples of such a resin are for example adhesives comprising thermoplastic resins having a carboxylic group in the molecule chain; examples include UV-curable materials (for example, 31X-101 (manufactured by ThreeBond Co., Ltd.) and similar in addition to Himilan (manufactured by Du Pont-Mitsui Polychemicals Co., Ltd.), Bynel (manufactured by Du Pont K.K.), Aron Alpha (manufactured by Toagosei Co., Ltd.) The sealing member 17 may be formed from only a resin, or may be formed from a resin and an inorganic filler.

Further, when the working electrode 14 and counter electrode 24 are seen along the direction connecting the working electrode 14 and the counter electrode 24, this sealing member 17 is provided such that the first electrode 15 of the working electrode 14 and the second electrode 25 as the counter electrode 24 extend from the region encompassed by the outer periphery of the sealing member 17. Hence the first electrode 15 of the working electrode 14 has an extended portion 15a extending to the outside from the region encompassed by the sealing member 17, and the second electrode 25 as the counter electrode 24 has an extended portion 25a extending to the outside from the region encompassed by the sealing member 17. Because the counter electrode 24 has flexibility, the extended portion 25a has flexibility. As the width of the extended portion 25a having flexibility, no limitations in particular are imposed, but it is preferable that the width be greater than the thickness of the sealing member 17. And, as the extent of the flexibility of the extended portion 25a, no limitations in particular are imposed, but it is for example preferable that the extended portion 25a flex to approximately just before reaching the surface of the first electrode 15 of the working electrode 14.

Next, electrical connection together of the photoelectric conversion element modules 1 (10A, 10B, ... ) is explained.

As explained above, the first electrode 15 of the working electrode 14 has a base material 11 on the side opposite the side of the counter electrode 24, and the base materials 11 of each of the plurality of photoelectric conversion elements 10 (10A, 10B, ... ) are formed integrally with each other. Hence the plurality of photoelectric conversion elements 10 (10A, 10B, ... ) are arranged in planar form such that the directions from the working electrodes 14 toward the counter electrodes 24 are the same. Further, adjacent photoelectric conversion elements 10A, 10B are arranged such that the working electrode 14 of one photoelectric conversion element 10A and the counter electrode 24 of the other photoelectric conversion element 10B overlap, when viewing the working electrode 14 and counter electrode 24 along the direction connecting the working electrode 14 and counter electrode 24.

And, in the adjacent photoelectric conversion elements 10A and 10B, the working electrode 14 of one photoelectric conversion element 10A and the counter electrode 24 of the other photoelectric conversion element 10B are electrically connected by the conductive member 30. Specifically, the conductive member 30 is connected to the extended portion 15a in the first electrode of the working electrode 14 of the photoelectric conversion element 10A, and to the extended portion 25a of the second electrode 25 as the counter electrode 24 of the photoelectric conversion element 10B. By this means, the adjacent photoelectric conversion elements 10A and 10B are connected in series. The extended portion 25a of the second electrode 25 is connected to the conductive member 30 with the extended portion flexed toward the side of the first electrode 15.

As the conductive member 30, no limitations in particular are imposed, but for example a conductive paste or solder may be used.

Examples of the conductive paste are pastes comprising a mixture of a conductive material and a binder resin. The conductive material may comprise one, or two or more among, gold, platinum, tin, silver, nickel, carbon, and copper. It is preferable that the conductive material be in particle form. The binder may comprise one, or two or more among, an acrylic resin, vinyl acetate resin, epoxy resin, and polyester resin. As the amount of binder used, relative to 100 parts by weight conductive material, 0.2 to 10 parts by weight, and preferably 0.5 to 5 parts by weight, are suitable. Such a conductive paste deforms suitably, and in the connection portion for the adjacent photoelectric conversion elements 10A and 10B, in a state in which the extended portion 25a of the second electrode 25 of the photoelectric conversion element 10B is intentionally caused to flex toward the side of the first electrode 15 of the photoelectric conversion element 10A, the second electrode 25 of the photoelectric conversion element 10B can be connected to the conductive member 30. By this means, close adhesion of the first electrode 15 and second electrode 25 with the conductive member 30 becomes easily, and moreover connection reliability can be improved.

Further, as the solder, no limitations in particular are imposed, but high-melting-point solder or low-melting-point solder may be used. As high-melting-point solder, use of a solder with a melting point of 200° C. or higher (for example, 210° C. or higher) is suitable. Examples of such high-melting-point solders include Sn—Cu system, Sn—Ag system, Sn—Ag—Cu system, Sn—Au system, Sn—Sb system, Sn—Pb system (where the Pb content exceeds for example 85 weight %), and similar. Of these, one may be used alone, or two or more may be used together. By using such a high-melting-point solder, connection can easily be performed even when the conductive plate 21 of the second electrode 25 is of a metal, such as titanium, which is not easily soldered. On the other hand, as a low-melting-point solder, for example use of a solder with a melting point of less than 200° C. is suitable. Examples of such solders include eutectic types (for example Sn—Pb and similar), lead-free types (for example Sn—Ag, Sn—Cu, Sn—Ag—Cu, Sn—Zn, Sn—Zn—B, and similar), and similar. By using a low-melting-point solder, when electrically connecting together the photoelectric conversion elements 10 (10A, 10B, . . . ), heating to a high temperature of the sensitizing dye carried by the porous oxide semiconductor layer 13 and the electrolyte 18 can be suppressed, and by this means degradation of the sensitizing dye and the electrolyte 18 can be suppressed.

According to the photoelectric conversion element module 1 of this embodiment, in adjacent photoelectric conversion elements 10A and 10B, the extended portion 15a in the first electrode 15 of one photoelectric conversion element 10A and the extended portion 25a in the second electrode 25 of the other photoelectric conversion element 10B are connected by the conductive member 30. And, the extended portion 25a of the second electrode 25 has flexibility. Hence even when force is applied from outside and a stress is applied between the conductive member 30 and the first electrode 15 or the second electrode 25, or even when deformation of the conductive member 30 occurs due to aging and a stress is applied between the conductive member 30 and the first electrode 15 or the second electrode 25, the extended portion 25a of the second electrode 25 having flexibility flexes, and by this means the stress is absorbed. By absorption of stress by the extended portion 25a having flexibility in this way, breakage between the conductive member 30 and the first electrode 15 or the second electrode 25 or similar is suppressed. Hence the reliability of electrical connection of photoelectric conversion elements 10 (10A, 10B, . . . ) with each other can be enhanced.

Further, in the photoelectric conversion element module 1, the plurality of photoelectric conversion elements 10 (10A, 10B, . . . ) are formed integrally through the base material 11. Hence changes in the positions of adjacent photoelectric conversion elements 10A and 10B relative to each other are suppressed. Consequently the application of stress between the working electrodes 14 and counter electrodes 24 and the conductive member 30 is suppressed, and the reliability of connection of the photoelectric conversion elements 10 (10A, 10B, . . . ) with each other can be further enhanced.

In the photoelectric conversion element module 1, because the extended portion 25a in the second electrode 25 is flexed toward the side of the first electrode 15 and connected with the conductive member 30, even when the conductive member 30 is connected in a state of protruding on the side opposite the side of the first electrode 15 at the extended portion 25a of the second electrode 25, the thickness of the photoelectric conversion element module 1 can be suppressed. Because the extended portion 25a of the second electrode 25 is flexed toward the side of the first electrode 15, a stress of pressing to the side of the first electrode 15 is imparted to the second electrode 25. Hence the counter electrode 24 and the sealing member 17 are firmly connected, and the photoelectric conversion element module 1 can have excellent durability.

Next, a method for manufacturing a photoelectric conversion element module 1 of this invention is explained.

A method for manufacturing a photoelectric conversion element module 1 comprises a preparation process of preparing the plurality of photoelectric conversion elements 10 (10A, 10B, . . . ) shown in FIG. 1 by arranging in planar form, such that the directions from the first electrodes 15 toward the second electrodes 25 are the same, and a connection process of electrically connecting the plurality of photoelectric conversion elements 10 (10A, 10B, . . . ) to each other using the conductive member 30.

First, a method for manufacturing a photoelectric conversion element module 1 is explained for a case in which, in the photoelectric conversion element module 1 shown in FIG. 1, conductive paste is used as the conductive member 30.

Figure 4:
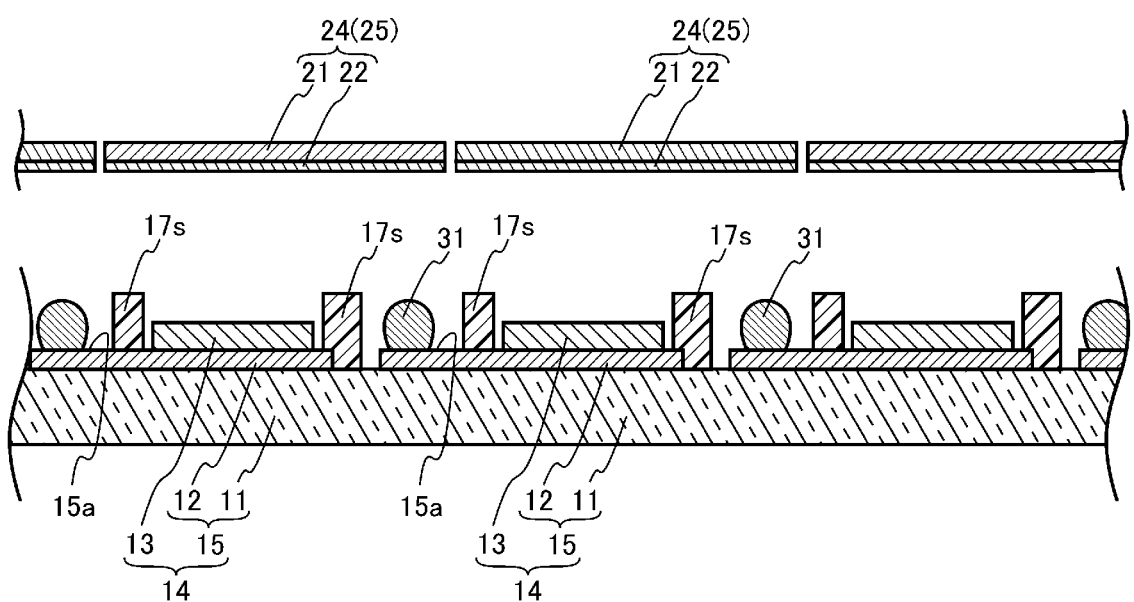
FIG. 4 is a cross-sectional view showing the appearance of a cross-section in a preparation process of a method for manufacturing a photoelectric conversion element module.
Figure 5:
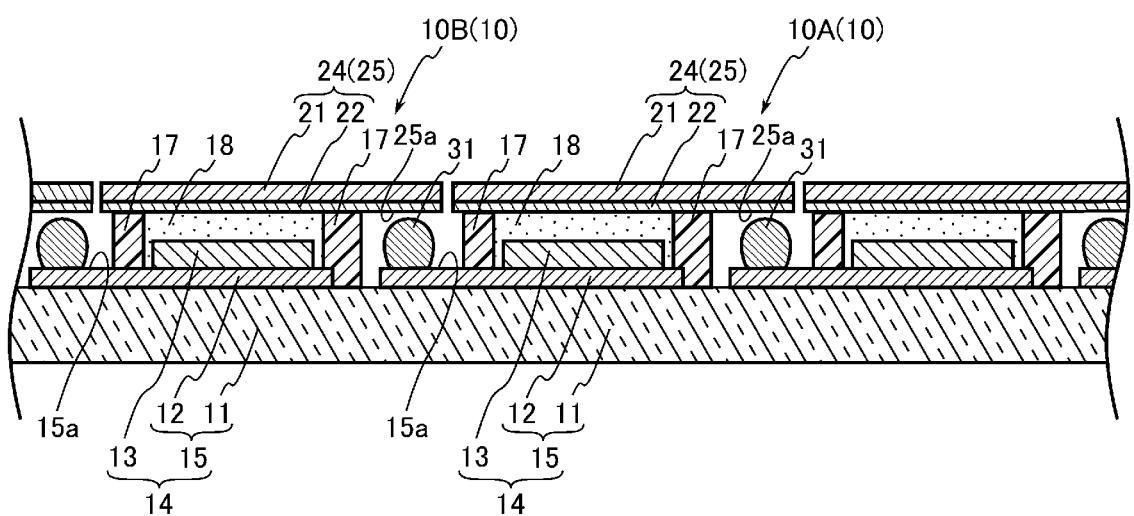
FIG. 5 is a cross-sectional view showing the appearance of a cross-section in a preparation process of a method for manufacturing a photoelectric conversion element module.
Figure 6:
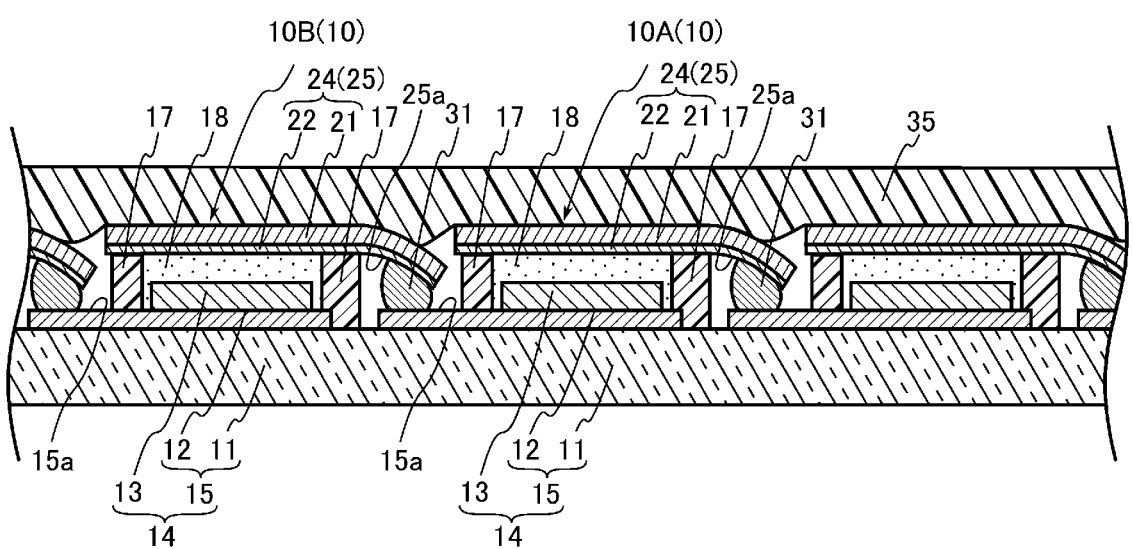
FIG. 6 is a cross-sectional view showing the appearance of a cross-section in a connection process of a method for manufacturing a photoelectric conversion element module.

FIG. 2 to FIG. 5 are cross-sectional views showing the appearance of a cross-section in the preparation process of the method for manufacturing a photoelectric conversion element module, and FIG. 6 is a cross-sectional view showing the appearance of a cross-section in the connection process.

(Preparation Process)

Each of the photoelectric conversion elements 10 (10A, 10B, . . . ) is obtained by preparing a working electrode 14 and a counter electrode 24, and laminating together the working electrode 14 and counter electrode 24, with the electrolyte 18 sealed between the working electrode 14 and the counter electrode 24 by the sealing member 17.

The working electrode 14 can be obtained by the following process.

First, a transparent conductive film 12 is formed so as to cover the entire region of one face of a transparent base material 11, to fabricate a transparent conductive substrate. Next, as shown in FIG. 2, a laser scribe or similar is used to break the transparent conductive film 12 at desired places. In this way, a first electrode 15 is obtained.

As the method of forming the transparent conductive film 12, no limitations in particular are imposed, and for example thin film formation method such as a sputtering method, CVD (chemical vapor deposition) method, spray pyrolysis deposition method (SPD method), evaporation deposition, or similar may be used.

Of these, it is preferable that the transparent conductive film 12 be formed using a spray pyrolysis deposition method. By forming the transparent conductive film 12 using a spray pyrolysis deposition method, the haze ratio can easily be controlled. Further, the spray pyrolysis deposition method does not require a reduced-pressure system, and so is suitable for enabling simplification and cost reduction in the manufacturing process.

Next, the porous oxide semiconductor layer 13 is formed at a prescribed position on the transparent conductive film 12 of the first electrode 15. Formation of this porous oxide semiconductor layer 13 principally comprises an application process and a drying/sintering process.

In the application process, for example a paste of a $TiO_2$ colloid, prepared by mixing $TiO_2$ powder and a surfactant at a prescribed ratio, is applied to the surface of the transparent conductive film 12 processed to have hydrophilic properties. As the method of application, well-known application method such as a screen printing method, inkjet printing method, roll coating method, doctor blade method, spray application method, or similar may be used.

In the drying/sintering process, after for example drying the applied colloid by leaving for approximately 30 minutes in air at room temperature, an electric furnace is used to perform sintering at a temperature of 350 to 550° C. for approximately 30 minutes.

Next, the porous oxide semiconductor layer 13 formed by this application process and drying/sintering process is caused to carry a sensitizing dye.

As a dye solution for carrying of the sensitizing dye, for example a solution is prepared in advance by adding and adjusting an extremely minute quantity of N719 powder to a solvent of acetonitrile and t-butanol at a volume ratio of 1:1.

Next, the porous oxide semiconductor layer 13, heat-treated at approximately 120 to 150° C. separately in an electric furnace, is immersed in the dye solution placed in a petri dish container, and in this state immersion is continued in a dark place for one day and night (approximately 20 hours). Thereafter, the porous oxide semiconductor layer 13 is retrieved from the dye solution and is washed using a mixed solution of acetonitrile and t-butanol.

In this way a working electrode 14, in which a porous oxide semiconductor layer 13 carrying a sensitizing dye is formed on the transparent conductive film 12, is obtained.

On the other hand, the counter electrode 24 is obtained by the following process.

First, the thin conductive plate 21 is prepared. When the conductive plate 21 is a metal plate of titanium, nickel or similar, or an oxide conductor such as ITO or FTO, or carbon or similar, the metal plate, oxide conductor, carbon or similar serves without modification as the conductive plate 21; when thin film of a conductive oxide, carbon or similar is provided on the surface of resin, glass or similar, the resin, glass or similar may be prepared, and the thin film of the conductive oxide or carbon may be formed on the surface thereof. This conductive oxide or carbon may be formed on the surface of resin, glass or similar by a sputtering method or similar. Further, when the conductive plate 21 is configured with a transparent conductive film provided on an insulating transparent base material, the insulating transparent base material is prepared, and the transparent conductive film is provided on the surface thereof to obtain the conductive plate 21. As the process of providing the transparent conductive film, a method similar to the process of providing a transparent conductive film 12 of the working electrode 14 may be performed.

And, a catalyst layer 22, of platinum or similar, is formed on the surface of the prepared conductive plate 21. The catalyst layer 22 is formed using a sputtering method or similar. By this means, a second electrode 25 having a conductive plate 21 and a catalyst layer 22 is obtained. And, this second electrode 25 becomes, without modification, the counter electrode 24. When the conductive plate 21 is of platinum, a catalyst layer 22 may not be provided.

In this way, the counter electrode 24 is obtained.

Figure 3:
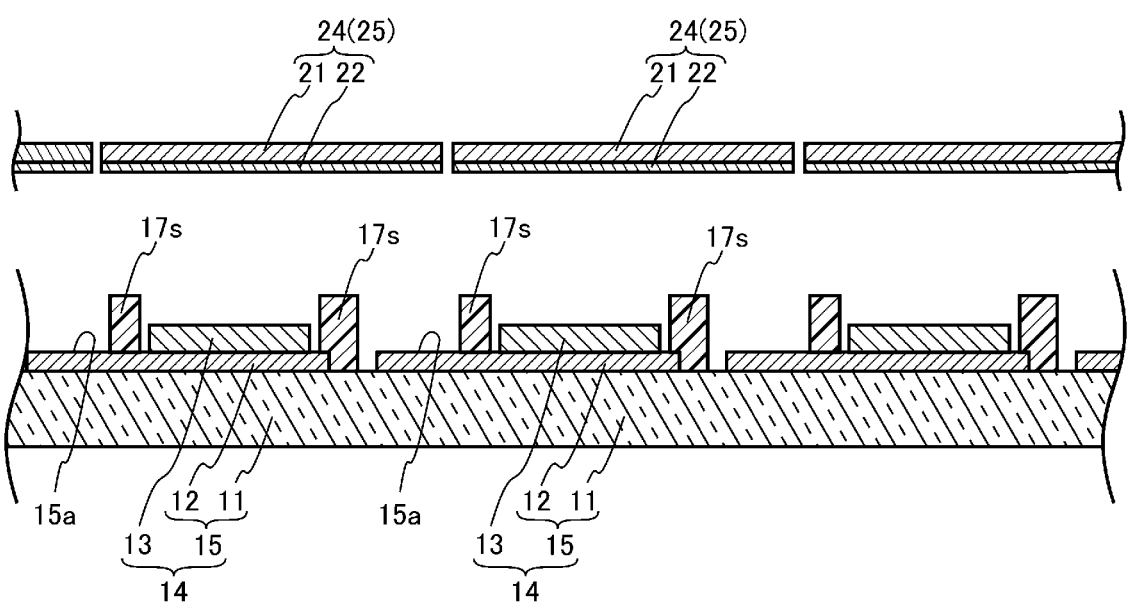
FIG. 3 is a cross-sectional view showing the appearance of a cross-section in a preparation process of a method for manufacturing a photoelectric conversion element module.

Next, as shown in FIG. 3, a resin 17s, or a precursor thereof, which becomes the sealing member 17, is formed on the first electrode 15 of the working electrode 14. At this time the resin 17s or precursor thereof is formed so as to encompass the porous oxide semiconductor layer 13 of the working electrode 14. When the resin 17s is a thermoplastic resin, the resin 17s can be obtained either by applying the melted resin onto the working electrode 14 and then inducing natural cooling at room temperature, or by bringing the film-state resin into contact with the working electrode 14 and using an external heat source to cause heating and melting of the resin, followed by natural cooling at room temperature. As the thermoplastic resin, for example an ionomer or an ethylene-methacrylate copolymer is used. When the resin 17s is an ultraviolet ray-cured resin, the ultraviolet ray-curable resin which is a precursor of the resin 17s is applied onto the working electrode 14. When the resin 17s is a water-soluble resin, an aqueous solution containing the resin is applied onto the working electrode 14. As the aqueous resin, for example a vinyl alcohol polymer is used.

Next, as shown in FIG. 4, conductive paste 31 is arranged on the outside of the resin 17s or precursor thereof, to become the sealing member 17 on the working electrode 14. As the method of arranging the conductive paste 31, for example a screen printing method, an inkjet printing method, a roll coating method, a doctor blade method, a spray application method, or similar is used.

Next, as shown in FIG. 5, the electrolyte 18 is injected, the working electrode 14 and counter electrode 24 are joined together, and each of the photoelectric conversion elements 10 (10A, 10B, . . . ) is obtained. Specifically, the region encompassed by the resin 17s or precursor thereof on the working electrode 14 is filled with electrolyte, the working electrode 14 and counter electrode 24 are brought into opposition, and the resin 17s on the working electrode 14 is brought into contact with the counter electrode 24. Then, in a reduced-pressure environment, when the resin 17s is a thermoplastic resin, the resin is heated and melted, and the working electrode 14 and counter electrode 24 are bonded. In this way the sealing member 17 is obtained. When the resin 17s is an ultraviolet ray-cured resin, after bringing the resin 17s of the working electrode 14 into contact with the counter electrode 24, ultraviolet rays are used to cure the ultraviolet ray-curable resin, and the sealing member 17 is obtained. When the resin 17s is a water-soluble resin, after bringing the resin 17s on the working electrode 14 into contact with the counter electrode 24, drying at room temperature is induced, after which drying in a reduced-humidity environment is induced, and the sealing member 17 is obtained.

In this way, a plurality of photoelectric conversion elements 10 (10A, 10B), arranged in planar form such that the directions from the working electrodes 14 toward the counter electrodes 24 are the same, can be obtained.

When the electrolyte is a liquid, prior to bonding together the working electrode 14 and the counter electrode 24, bonding together may be performed without injecting the electrolyte. In this case, for example holes penetrating in the thickness direction are opened in advance in at least two places in the counter electrode 24. And, the electrolyte is injected from one of the holes into the space surrounded by the working electrode 14, the counter electrode 24, and the sealing member 17 to obtain the electrolyte 18, after which the holes are sealed.

(Connection Process)

Next, the plurality of photoelectric conversion elements (10A, 10B, . . . ) are electrically connected to each other using conductive paste 31.

As shown in FIG. 6, in order to electrically connect the plurality of photoelectric conversion elements 10 (10A, 10B, . . . ) to each other using conductive paste 31, in a state in which the working electrode 14 is arranged on a workstand, not shown, force is applied to the extended portion 25a of the second electrode 25 which is the counter electrode 24 so that the extended portion 25a approaches the extended portion 15a in the first electrode 15 of the working electrode 14, and the extended portion 25a is caused to flex toward the side of the extended portion 15a. In this way the counter electrode 24 and the conductive paste 31, and the working electrode 14 and the conductive paste 31 are brought into contact. Then, in a state in which the counter electrode 24 and the conductive paste 31, and the working electrode 14 and the conductive paste 31 are in contact, the conductive paste 31 is hardened, and, as the conductive member 30, electrically connects the working electrode 14 and the counter electrode 24.

In order to apply force to the extended portion 25a of the counter electrode 24 so that the counter electrode 24 approaches the working electrode 14, for example as shown in FIG. 6, the counter electrode 24 is covered by a sponge-form elastic member 35, and a prescribed pressure is applied from the side of the counter electrode 24 toward the side of the working electrode 14. By this means, the extended portion 25a of the counter electrode having flexibility comes into close contact with the conductive paste 31 together with flexing toward the side of the working electrode 14.

In this way, the photoelectric conversion element module 1 shown in FIG. 1 is obtained.

Next, a method of manufacture to manufacture the photoelectric conversion element module 1 in a case in which, in the photoelectric conversion element module 1 shown in FIG. 1, solder is used as the conductive member 30, is explained.

Figure 7:
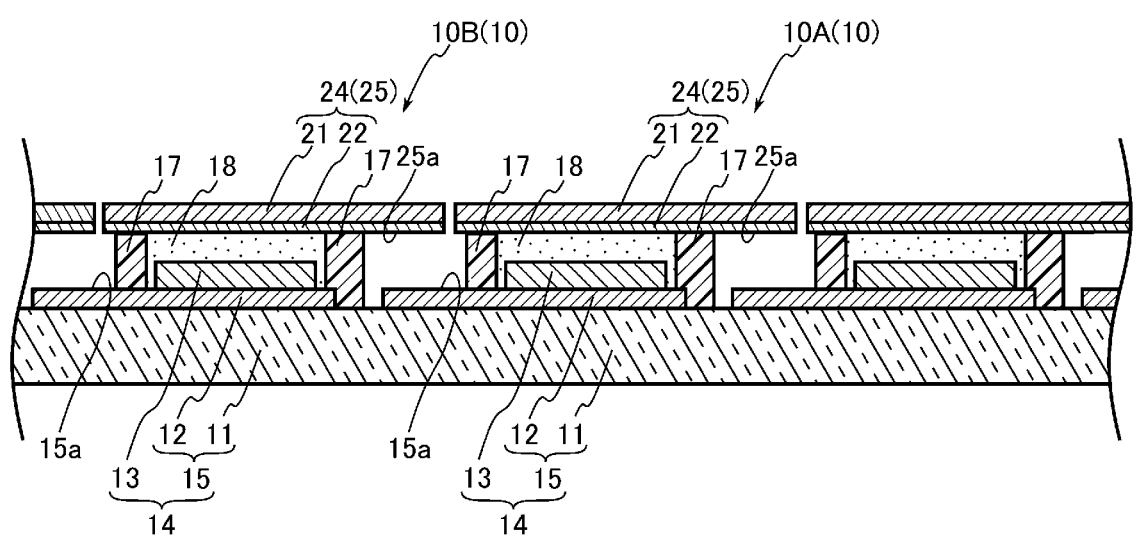
FIG. 7 is a cross-sectional view showing the appearance of a cross-section in a preparation process of a method for manufacturing a photoelectric conversion element module.
Figure 8:
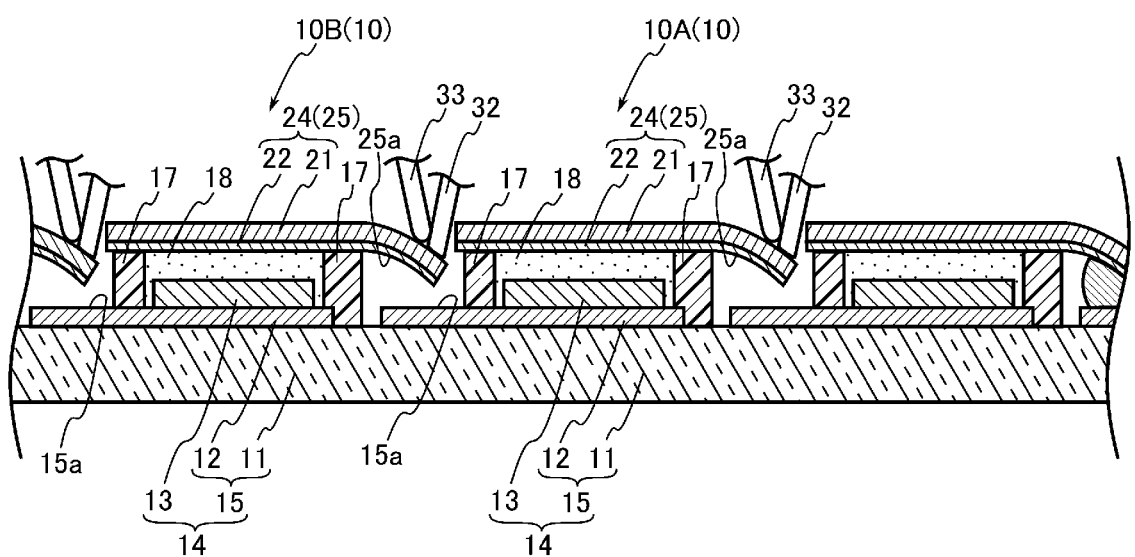
FIG. 8 is a cross-sectional view showing the appearance of a cross-section in a connection process of a method for manufacturing a photoelectric conversion element module.

FIG. 7 is a cross-sectional view showing the appearance of a cross-section in the preparation process of the method for manufacturing a photoelectric conversion element module 1; FIG. 8 is a cross-sectional view showing the appearance of a cross-section in the connection process of the method for manufacturing a photoelectric conversion element module 1.

(Preparation Process)

First, similarly to the processes explained using FIG. 2 and FIG. 3, a working electrode 14 and a counter electrode 24 are prepared, and a resin or precursor thereof to become the sealing member 17 is formed on the working electrode 14 and on the counter electrode 24.

Next, as shown in FIG. 7, the working electrode 14 and counter electrode 24 are bonded together, such that the electrolyte 18 is sealed between the working electrode 14 and counter electrode 24 by the sealing member 17. The process of bonding together the working electrode 14 and counter electrode 24 such that the electrolyte 18 is sealed by the sealing member 17 may be performed similarly to the process of bonding together the working electrode 14 and counter electrode 24 when using conductive paste as the conductive member 30.

In this way, a plurality of photoelectric conversion elements 10 (10A, 10B), arranged in planar form such that such that the directions from the working electrodes 14 toward the counter electrodes 24 are the same, can be obtained.

(Connection Process)

Next as shown in FIG. 8, the plurality of photoelectric conversion elements 10 (10A, 10B, . . . ) are electrically connected to each other using solder.

First, the tip 33 of a heated soldering iron, the solder 32, and the extended portion 25a of the second electrode 25 are brought into contact. At this time, force is applied from the soldering iron tip 33 to the extended portion 25a such that the extended portion 25a approaches the working electrode 14. In this way the extended portion 25a is flexed toward the side of the working electrode 14. And, through the heat of the soldering iron tip 33, the solder 32 melts, and the melted solder 32 enters into the space between the transparent conductive film 12 of the extended portion 15a of the working electrode 14 and the extended portion 25a of the counter electrode 24. Thereafter, by removing the soldering iron tip 33 from the extended portion 25a of the counter electrode 24, the solder 32 hardens, and the solder 32 electrically connects the working electrode 14 and the counter electrode 24 as the conductive member 30.

When connecting the solder 32 and extended portion 25a and the solder 32 and extended portion 15a, it is preferable that the soldering iron tip 33 vibrate as if generating ultrasonic waves. Through vibration of the soldering iron tip 32 in this way, wettability of the solder 32 improves, and connection properties of the transparent conductive film 12 and solder 32 at the extended portion 25a of the counter electrode 24 and at the extended portion 15a of the working electrode 14 are improved. And, it is preferable that the vibration frequency of the soldering iron tip be between 10 and 200 kHz, and still more preferable that the frequency be 20 to 100 kHz, from the standpoint of preventing damage to the transparent conductive film 12 of the counter electrode 24 and the working electrode 14.

In this way, the photoelectric conversion element module 1 shown in FIG. 1 is obtained.

According to the method for manufacturing a photoelectric conversion element module 1 of this embodiment, in each of the plurality of photoelectric conversion elements 10 (10A, 10B, . . . ), the working electrode 14 and counter electrode 24 have extended portions 15a, 16a extending outside the region encompassed by the outer periphery of the sealing member 17. And, in the connection process, in the adjacent photoelectric conversion elements 10A and 10B, the extended portion 15a of the working electrode 14 of one photoelectric conversion element 10A and the extended portion 25a of the counter electrode 24 of the other photoelectric conversion element 10B are connected by the conductive members 31, 32. At this time, the extended portion 25a of the counter electrode 24 has flexibility, so that flexing of the extended portion 25a is possible. Hence in the connection process, even when the conductive members 31, 32 are deformed, the extended portion 25a flexes so as to follow the deformation of the conductive members 31, 32, and deformation of the conductive members 31, 32 can be absorbed by the extended portion 25a. In this way the conductive members 31, 32 can be connected appropriately with the extended portions 15a, 16a of the working electrode 14 and counter electrode 24, and a photoelectric conversion element module 1 with high reliability of electrical connection of the photoelectric conversion elements 10A and 10B to each other can be manufactured.

Further, in the method for manufacturing a photoelectric conversion element module 1, force is applied to the extended portion 25a of the counter electrode 24 so that the extended portion 15a of the working electrode 14 and the extended portion 25a of the counter electrode 24 approach each other. Hence even when the conductive members 31, 32 are deformed, the extended portion 25a can appropriately follow the deformation of the conductive members 31, 32. Hence a photoelectric conversion element module 1 with high reliability of electrical connection of the photoelectric conversion elements 10A and 10B to each other can be manufactured.

Second Embodiment

Figure 9:
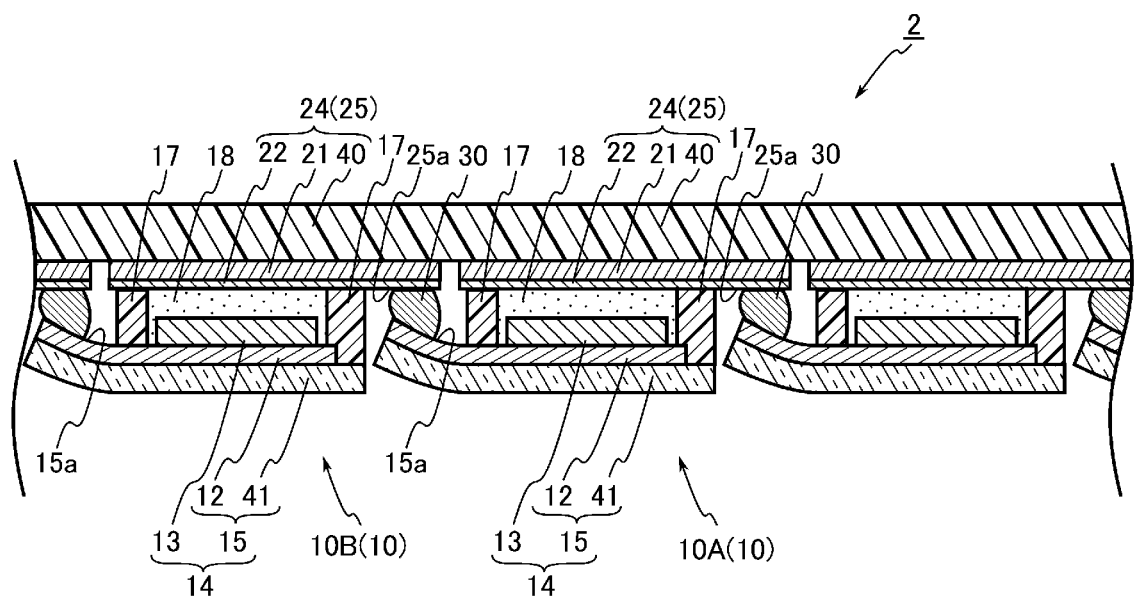
FIG. 9 is a cross-sectional view showing the construction in a cross-section of the photoelectric conversion element module of a second embodiment of the invention.

Next, a second embodiment of the invention is explained in detail, referring to FIG. 9. Constituent elements which are the same as or equivalent to those in the first embodiment are assigned the same reference symbols, and redundant explanations are omitted. FIG. 9 is a cross-sectional view showing the construction in a cross-section of the photoelectric conversion element module of the second embodiment of the invention.

As shown in FIG. 9, the photoelectric conversion element module 2 of this embodiment differs from those of the photoelectric conversion element module 1 in the first embodiment in the working electrodes 14 and counter electrodes 24.

A working electrode 14 in this embodiment differs from a working electrode 14 of the photoelectric conversion element module 1 in the first embodiment in that the transparent conductive film 12 is provided on a transparent base material 41 provided separately for each of the plurality of photoelectric conversion elements 10 (10A, 10B, . . . ).

The working electrode 14 has overall optical transmissivity and flexibility, and has an extended portion 15a extending from the region encompassed by the outer periphery of the sealing member 17. Hence this extended portion 15a has flexibility. No limitations in particular are imposed on the width of the extended portion 15a having flexibility, but it is preferable that the width be greater than the thickness of the sealing member 17. And, no limitations in particular are imposed on the extent of the flexibility of the extended portion 15a, but it is preferable that, for example, the extended portion 15a flex to approximately just before reaching the surface of the counter electrode 24.

As the material from which the base material 41 of the working electrode 14 is formed, no limitations in particular are imposed so long as the material is transparent and has flexibility; for example, polyethylene terephthalate, polycarbonate, polyester sulfone, and similar may be used. The base material 41 is selected appropriately from among these, taking into consideration resistance to the electrolytic solution and similar. Further, it is preferable that the base material 41 be formed from material having, to the extent possible, excellent optical transmissivity, and formation from a material having transmissivity of 90% or higher is still more preferable.

On the other hand, a counter electrode 24 of this embodiment differs from a counter electrode 24 of the photoelectric conversion element module 1 of the first embodiment in having a base material 40 which is made integral with the plurality of photoelectric conversion elements 10 (10A, 10B, . . . ), and, on the base material 40, a conductive plate 21 provided for each of the photoelectric conversion elements 10 (10C, 10D, . . . ), and a catalyst layer 22 provided on the surface of the conductive plate 21. In this embodiment, the counter electrode 24 may have flexibility, or may not have flexibility, and may have optical transmissivity, or may not have optical transmissivity.

With respect to the base material 40, when the counter electrode 24 does not have optical transmissivity in particular, no limitations in particular are imposed on the material for the counter electrode 24; for example, an insulating material is used in formation, or a metal plate where is formed an insulator, not shown, between the metal plate and the conductive plate 21 is formed. As such insulating materials, no limitations in particular are imposed, and for example resin such as polyethylene terephthalate, polycarbonate, polyether sulfone, polyethylene naphthalate, acrylics, fluorine resins, vinyl chloride or similar, ceramics such as alumina or similar, glass, or similar may be used. No limitations in particular are imposed on the metal plate with an insulator formed used as the base material 40, and for example nickel plate, stainless steel (SUS) plate, iron plate, or similar can be used. When the counter electrode 24 has optical transmissivity, a material similar to that of the base material 11 in the first embodiment can be used as the base material 40.

As the material of the conductive plate 21, no limitations in particular are imposed so long as the material is a conductor, regardless of whether there is optical transmissivity or not; when the counter electrode 24 does not have optical transmissivity in particular, for example metals such as titanium, nickel, platinum or similar, oxide conductors such as ITO, FTO or similar, carbon or similar may be used. In this case, an oxide conductor may be colored. Further, an oxide conductor, carbon or similar may be a thin film provided on the surface of resin, glass or similar. When the counter electrode 24 has optical transmissivity, the conductive plate 21 is for example formed from a material similar to the transparent conductive film 12 of the working electrode 14.

And, in adjacent photoelectric conversion elements 10A and 10B, the working electrode 14 of one of the photoelectric conversion elements 10A and the counter electrode 24 of the other photoelectric conversion element 10B are connected by the conductive member 30. Specifically, the conductive member 30 connects the extended portion 15a of the working electrode 14 of the photoelectric conversion element 10A and the extended portion 25a of the counter electrode 24 of the photoelectric conversion element 10B. In this way, adjacent photoelectric conversion elements 10A and 10B are connected in series. The extended portion 15a of the working electrode 14 is connected to the conductive member 30 in a state of being flexed toward the side of the counter electrode 24.

When the base material 40 of the counter electrode 24 is formed from a metal plate where is formed an insulator between the metal plate and the conductive plate 21, compared with a case in which the base material 40 is formed from a resin or similar, the rigidity of the base material 40 is high, so that the base material 40 can be made thin.

Next, a method for manufacturing the photoelectric conversion element module 2 is explained.

(Preparation Procedure)

First, base material 41 is prepared for each of the photoelectric conversion elements 10 (10A, 10B, . . . ). And, the transparent conductive film 12 is formed on one of the surfaces of this base material 41. Formation of the transparent conductive film 12 may employ a method similar to that used for the transparent conductive film 12 in the first embodiment. And, similarly to the first embodiment, the porous oxide semiconductor layer 13 is formed on the transparent conductive film 12, and the porous oxide semiconductor layer 13 is made to carry a sensitizing dye, to obtain the working electrode 14.

On the other hand, when in the counter electrode 24 the conductive plate 21 is formed from metal, an oxide conductor, carbon, or similar, the base material 40 is prepared, and the conductive plate 21 is affixed onto the base material 40 using an adhesive or similar. Further, when the conductive plate 21 is formed from material similar to that of the transparent conductive film 12 of the working electrode 14, a transparent conductive film is formed as the conductive plate 21 on one face of the prepared transparent base material 40. Formation of the transparent conductive film may employ a method similar to that for the transparent conductive film 12 in the first embodiment.

Thereafter, sealing using the sealing member 17 is performed similarly to the first embodiment.

(Connection Process)

When the conductive member 30 is a conductive paste, in a state in which the counter electrode 24 is arranged on a workstand, not shown, force is applied to the extended portion 15a of the working electrode 14 so that the extended portion 15a of the working electrode 14 approaches the extended portion 25a of the counter electrode 24, and the extended portion 15a of the working electrode 14 is caused to flex toward the side of the counter electrode 24. In this way the working electrode 14 and the conductive paste, and the counter electrode 24 and the conductive paste are brought into contact. Then, in a state in which the counter electrode 24 and the conductive paste, and the working electrode 14 and the conductive paste are in contact, the conductive paste is hardened, and, as the conductive member 30, electrically connects the working electrode 14 and the counter electrode 24.

In order to apply force to the extended portion 15a of the working electrode 14 so that the extended portion 15a of the working electrode 14 approaches the extended portion 25a of the counter electrode 24, the working electrode 14 is covered by a sponge-form elastic member, and a prescribed pressure is applied toward the counter electrode 24. By this means, the extended portion 15a of the working electrode 14 having flexibility flexes toward the side of the counter electrode 24, and comes into close contact with the conductive paste.

In this way, the photoelectric conversion element module 2 shown in FIG. 9 is obtained.

Further, when the conductive member 30 is solder, first the tip of a heated soldering iron is brought into contact with solder and the extended portion 15a of the working electrode 14. At this time, force is applied to the extended portion 15a by the soldering iron tip such that the extended portion 15a of the working electrode 14 approaches the extended portion 25a of the counter electrode 24. In this way the extended portion 15a is flexed toward the side of the counter electrode 24. And, through the heat of the soldering iron tip, the solder melts, and the melted solder enters into the space between the extended portion 15a of the working electrode 14 and the extended portion 25a of the counter electrode 24. Thereafter, by removing the soldering iron tip from the extended portion 15a, the solder hardens, and the solder electrically connects the working electrode 14 and the counter electrode 24 as the conductive member 30.

In this way, the photoelectric conversion element module 2 shown in FIG. 9 is obtained.

Third Embodiment

Next, a third embodiment of the invention is explained in detail referring to FIG. 10. Constituent elements which are the same as or equivalent to those in the first embodiment are assigned the same reference symbols, and redundant explanations are omitted. FIG. 10 is a cross-sectional view showing the construction in a cross-section of the photoelectric conversion element module of the second embodiment of the invention.

As shown in FIG. 10, the photoelectric conversion element module 3 of this embodiment differs from the photoelectric conversion element module 1 in the first embodiment in that the first electrode 15 has a current collector wire 16 provided on the transparent conductive film 12, and in that the conductive member 30 is connected to the current collector wire 16 in the working electrode 14.

The current collector wire 16 is provided from the region encompassed by the sealing member 17 to the extended portion 15a of the working electrode 14. The current collector wire 16 is entirely covered by a wire protection layer 19 in the region encompassed by the sealing member 17, so that contact between the electrolyte 18 and the current collector wire 16 is prevented.

The material forming the current collector wire 16 may be a material having resistance lower than that of the transparent conductive film 12; examples of such a material include for example a metal such as gold, silver, copper, platinum, aluminum, titanium, nickel, or similar. Of these, it is preferable that the material be the same as the conductor of the conductive member 30. When in this way the material forming the current collector wire 16 and the material forming the conductive member 30 are the same material, contact resistance between the current collector wire 16 and the conductive member can be suppressed.

As the material forming the wire protection layer 19, inorganic insulating material such as for example a lead-free transparent low-melting-point glass frit or similar may be used.

In order to prevent contact of the electrolyte 18 and the current collector wire 16 over a longer period, and in order to prevent the generation of dissolved components of the wire protection layer 19 when the electrolyte 18 makes contact with the wire protection layer 19, it is preferable that the wire protection layer 19 be covered by chemical-resistant resin, not shown such as a polyimide, fluoride resin, ionomer, ethylene-vinyl acetate anhydride copolymer, ethylene-methacrylate copolymer, ethylene-vinyl alcohol copolymer, ultraviolet ray-cured resin, vinyl alcohol polymer, or similar.

According to the photoelectric conversion element module 3 of this embodiment, the resistance of working electrodes can be reduced by the current collector wires 16. Further, by connecting conductive members 30 and current collector wires 16, the connection resistance of conductive members 30 and working electrodes 14 can be reduced even compared with a case in which conductive members 30 and transparent conductive film 12 are directly connected. Hence the efficiency of the photoelectric conversion element module 3 can be enhanced.

Next, a method for manufacturing the photoelectric conversion element module 3 is explained.

(Preparation Process)

First, the working electrodes 14 of each of the photoelectric conversion elements 10 (10A, 10B, . . . ) are prepared. In preparing a working electrode 14, methods similar to those of the first embodiment are used to form a transparent conductive film 12 on base material 11, and to provide a porous oxide semiconductor layer 13 on the transparent conductive film 12.

Next, the current collector wire 16 is provided on the transparent conductive film 12. After forming the porous oxide semiconductor layer 13, the current collector wire 16 can be obtained by applying a film of particles of the metal to form the current collector wire 16 from the region encompassed by the sealing member 17 to the region which is to become the extended portion 15a, and then heating and calcining.

In order to provide the wire protection layer 19, for example a paste obtained by mixing inorganic insulating material such as the above-described low-melting-point glass frit or similar with, as necessary, a thickening agent, bonding agent, dispersing agent, solvent, or similar, is applied by a screen printing method or similar so as to cover the entire region of the current collector wire 16 encompassed by the sealing member 17, followed by heating and sintering to obtain the wire protection layer 19.

When the wire protection layer 19 is covered by a chemical-resistant resin as described above, either a melted chemical-resistant resin is applied to the wire protection layer 19 and natural cooling at room temperature is performed, or a film-form chemical-resistant resin is brought into contact with the wire protection layer 19 and an external heat source is used to heat and melt the film-form chemical-resistant resin, after which natural cooling at room temperature is performed to obtain the chemical-resistant resin. As a thermoplastic chemical-resistant resin, for example an ionomer or ethylene-methacrylate copolymer is used. When the chemical-resistant resin is an ultraviolet ray-cured resin, after applying an ultraviolet ray-curable resin which is a precursor of the chemical-resistant resin onto the wire protection layer 19, ultraviolet rays are used to cure the above-described ultraviolet ray-curable resin, and by this means a chemical-resistant resin can be obtained. When the chemical-resistant resin is a water-soluble resin, by applying an aqueous solution containing the chemical-resistant resin onto the wire protection layer 19, a chemical-resistant resin can be obtained.

Other processes in the preparation processes are similar to the preparation processes of the first embodiment.

(Connection Process)

Next, the conductive member 30 and the current collector wire 16 of the working electrode 14, and the conductive member 30 and the extended portion 25a of the counter electrode 24 are connected. In connection processes, the conductive member 30 and the current collector wire 16 of the working electrode 14 are connected by connecting the conductive member 30 not to the transparent conductive film 12 of the working electrode 14, but the current collector wire 16; otherwise a method similar to the connection process of the first embodiment may be used.

In this way, the photoelectric conversion element module 3 shown in FIG. 10 is obtained.

Fourth Embodiment

Figure 11:
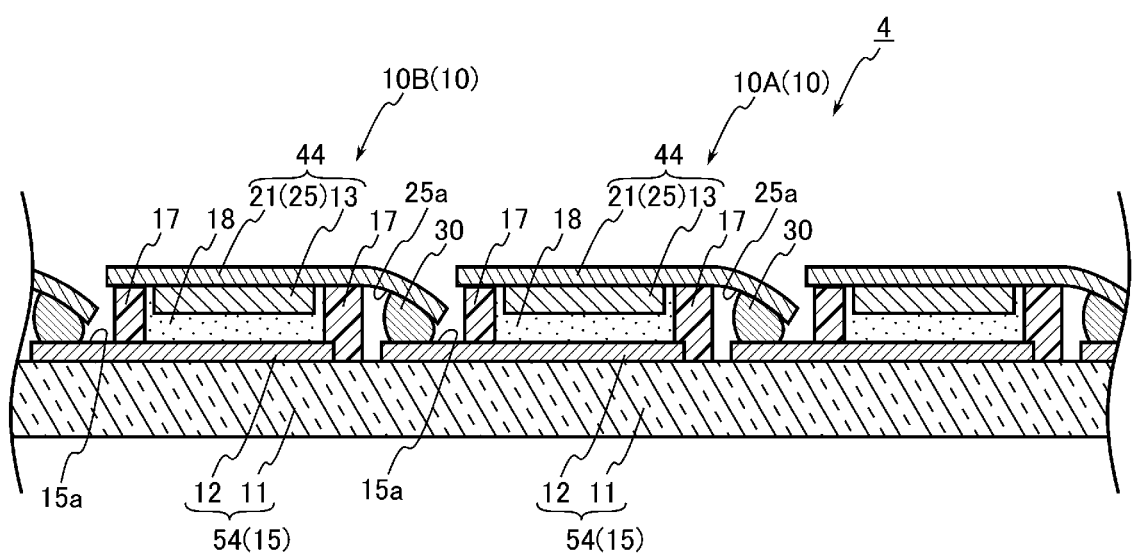
FIG. 11 is a cross-sectional view showing the construction in a cross-section of the photoelectric conversion element module of a fourth embodiment of the invention.
Figure 12:
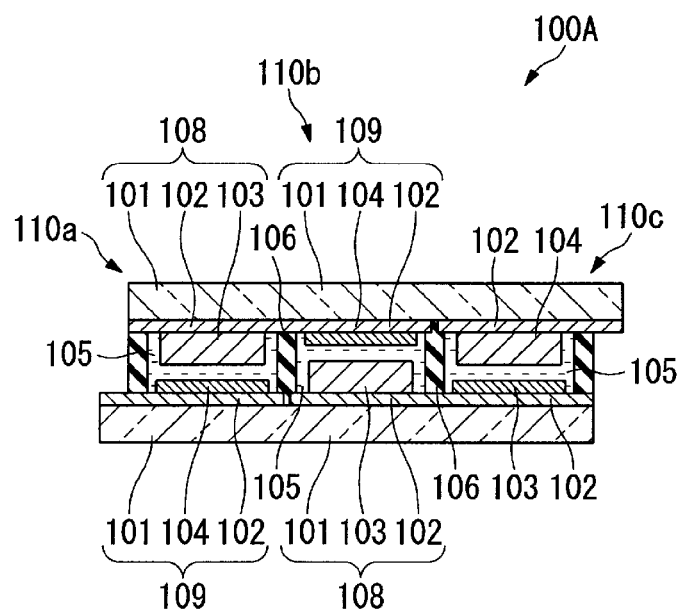
FIG. 12 is a cross-sectional view showing the construction in a cross-section of a photoelectric conversion element of the prior art.
Figure 13:
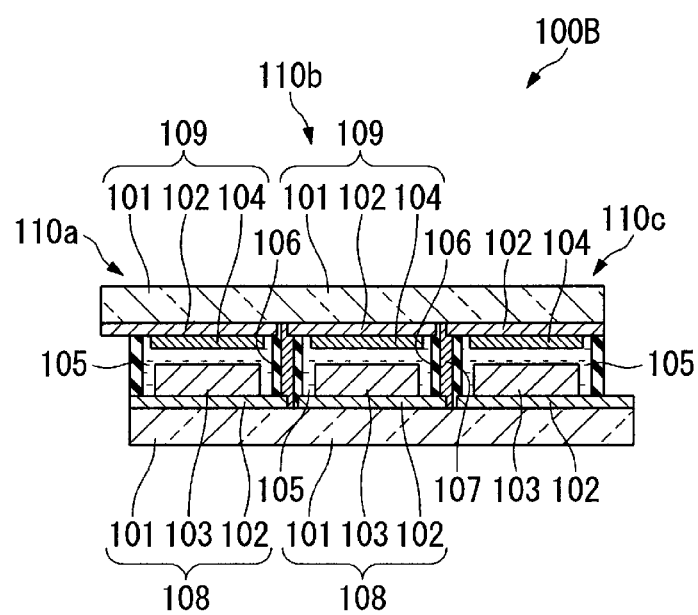
FIG. 13 is a cross-sectional view showing the construction in a cross-section of a photoelectric conversion element of the prior art.

A fourth embodiment of the invention is explained in detail referring to FIG. 11. Constituent elements which are the same as or equivalent to those in the first embodiment are assigned the same reference symbols, and redundant explanations are omitted. FIG. 11 is a cross-sectional view showing the construction in a cross-section of the photoelectric conversion element module of the fourth embodiment of the invention.

As shown in FIG. 11, the photoelectric conversion element module 4 of this embodiment differs from the photoelectric conversion element module 1 in the first embodiment in that, in the respective photoelectric conversion elements 10 (10A, 10B, . . . ), the counter electrode 54 is formed from a transparent base material 11, a transparent conductive film 12 formed on the base material 11, and a catalyst layer, not shown, formed on the transparent conductive film 12, and in that the working electrode 44 is formed from a conductive plate 21 as the second electrode 25, and a porous oxide semiconductor layer 13 carrying a sensitizing dye and provided on the conductive plate 21.

In the photoelectric conversion element module 4 of this embodiment, a porous oxide semiconductor 13 is not formed on the transparent conductive film 12, so that the transparent base material 11 can be formed from material susceptible to heat, and there are broader options for selecting the material of the base material 11.

Manufacture of the photoelectric conversion element module 4 is performed as follows.

(Preparation Process)

First, the working electrodes 44 are prepared. To prepare a working electrode 44, the second electrode 25, formed from the conductive plate 21, is prepared. In preparing the conductive plate 21, a method similar to that used for the conductive plate 21 in the first embodiment may be used. Next, the porous oxide semiconductor layer 13 is formed on the second electrode 25. As the method of forming the porous oxide semiconductor layer 13, a process similar to that for forming the porous oxide semiconductor layer 13 in the first embodiment may be used. Next, the porous oxide semiconductor layer 13 is made to carry the sensitizing dye. To induce carrying of the sensitizing dye, a process similar to that used in the first embodiment to cause the porous oxide semiconductor layer 13 to carry the sensitizing dye may be used. In this way, a working electrode 44 is obtained in which the porous oxide semiconductor layer 13 is formed on the second electrode 25.

Next, the counter electrode 54 is prepared. In preparation of the counter electrode 54, the transparent conductive film 12 is formed on the transparent base material 11, and a catalyst layer, not shown, is formed on the transparent conductive film 12 to obtain the first electrode 15. As the method for forming the transparent conductive film 12, a method similar to that used to form the transparent conductive film 12 on the base material 11 in the first embodiment may be used. To form the catalyst layer on the transparent conductive film 12, a method similar to that used to form the catalyst layer 22 on the conductive plate 21 in the first embodiment may be used. The first electrode 15 obtained in this way becomes the counter electrode 54.

Next, the electrolyte 18 is arranged in the vicinity of the porous oxide semiconductor layer 13, and sealing is performed using the sealing member 17. As the method of sealing, a method similar to the process to perform sealing using the sealing member 17 in the first embodiment may be used. At this time, an extended portion 25a is formed on the second electrode 25 of the working electrode 44 by the sealing member 17, and an extended portion 15a is formed on the first electrode 15 of the counter electrode 54.

Other processes in the preparation process are similar to those of the first embodiment.

(Connection Process)

Next, the conductive member 30 and the extended portion 15a of the counter electrode 54, and the conductive member 30 and the extended portion 25a of the working electrode 44, are connected. In the connection process, as the method of connection of the conductive member 30 and the extended portion 15a, and of the conductive member 30 and the extended portion 25a, a method similar to that of the connection process in the first embodiment may be used.

In this way, the photoelectric conversion element module 4 is obtained.

In the above, photoelectric conversion element modules and methods of manufacture of photoelectric conversion element modules of this invention have been explained, taking as examples the first to fourth embodiments; however, this invention is not limited to the above embodiments, and appropriate modifications can be made as necessary.

For example, in the second and third embodiments, the porous oxide semiconductor layer 13 is formed on the first electrode 15, and the working electrode 14 is formed from the first electrode 15 and the porous oxide semiconductor layer 13; however, this invention is not limited to such a configuration. For example, in the second and third embodiments, a configuration is possible in which the porous oxide semiconductor layer 13 is formed on the second electrode 25, the working electrode is formed from the second electrode 25 and the porous oxide semiconductor layer 13, and the counter electrode is formed from the first electrode 15.

Further, in the first to fourth embodiments, when the conductive plate 21 of the second electrode 25 is formed from titanium, it is appropriate to form a terminal of high-melting-point solder, or of copper, nickel or similar, at the position on the second electrode 25 at which the conductive member 30 is connected. In this case, the connection of the second electrode and the conductive member 30 is made firm, and the reliability of electrical connections between the photoelectric conversion elements can be further enhanced.

Further, in the first embodiment, when the conductive member 30 is formed from conductive paste, arrangement of the conductive paste 31 is performed before sealing using the sealing member 17; however, this invention is not limited to such a configuration. For example, even when the conductive member 30 is formed from conductive paste, in the state in which conductive paste is not arranged as shown in FIG. 7, the plurality of photoelectric conversion elements 10 (10A, 10B, . . . ) may be prepared, in the connection process the conductive paste 31 may be arranged between the transparent conductive film 12 of the extended portion 15a of the working electrode 14 and the extended portion 25a of the counter electrode 24, and thereafter the extended portion 25a of the counter electrode 24 may be flexed toward the side of the extended portion 15a as shown in FIG. 6, and the counter electrode 24 and conductive paste 31, and the working electrode 14 and conductive paste 31, may be connected.

INDUSTRIAL APPLICABILITY

According to this invention, a photoelectric conversion element module in which electrical connections of photoelectric conversion elements with each other are made satisfactory, as well as a method for manufacturing a photoelectric conversion element module, are provided.

EXPLANATION OF REFERENCE NUMERALS 1, 2, 3, 4 Photoelectric conversion element module
10, 10A, 10B Photoelectric conversion element
11 Base material
12 Transparent conductive film
13 Porous oxide semiconductor layer
14, 44 Working electrode
15 First electrode
15a Extended portion
17 Sealing member
18 Electrolyte
21 Conductive plate
24 Counter electrode
25 Second electrode
25a Extended portion
30 Conductive member
40, 41 Base material

The invention claimed is:

1. A photoelectric conversion element module, comprising:
a plurality of photoelectric conversion elements each having a first electrode plate, a second electrode plate, a sealing member, and an electrolyte; the first electrode plate and the second electrode plate oppose each other, the electrolyte is arranged between the first electrode plate and the second electrode plate, and the sealing member is connected to the first electrode plate and the second electrode plate, the sealing member encompassing the electrolyte between the first electrode plate and the second electrode plate; and
a conductive member electrically connecting the plurality of photoelectric conversion elements to each other,
the plurality of photoelectric conversion elements being arranged in planar form such that directions from the first electrodes plates toward the second electrodes plates are the same,
wherein each one of the first electrode plates and each one of the second electrode plates has a portion which, when viewing the first electrode plate and the second electrode plate along a direction connecting the first electrode plate and the second electrode plate, extends to outside a region encompassed by an outer periphery of the sealing member,
in adjacent photoelectric conversion elements, the conductive member connects the extended portion of the first electrode plate of one of the photoelectric conversion elements and the extended portion of the second electrode plate of the other photoelectric conversion element, the conductive member being provided between the sealing member of one of the photoelectric conversion elements and the sealing member of the other photoelectric conversion element and the conductive member being separated from the sealing members such that the conductive member does not contact the sealing members, and
one of the extended portion of the first electrode plate or the extended portion of the second electrode plate has flexibility, and the other one of the first electrode plate and the second electrode plate has an insulating base material on the side opposite the side of the one of the first electrode plate or the second electrode plate, and the base material in each of the plurality of photoelectric conversion elements are formed integrally with each other, and
wherein the one of the extended portion of the first electrode plate or the extended portion of the second electrode plate is flexed toward the other one of the first electrode plate and the second electrode plate.

2. The photoelectric conversion element module according to claim 1, characterized in that the first electrode plate has a transparent conductive film and a current collector wire provided on the transparent conductive film from a region encompassed by the sealing member to the extended portion, and the conductive member is connected with the current collector wire in the extended portion of the first electrode plate.

3. The photoelectric conversion element module according to claim 1, characterized in that the conductive member is either conductive paste or solder.

4. The photoelectric conversion element module according to claim 3, characterized in that the first electrode plate has a transparent conductive film and a current collector wire provided on the transparent conductive film from a region encompassed by the sealing member to the extended portion, and the conductive member is connected with the current collector wire in the extended portion of the first electrode plate and is conductive paste, and that the current collector wire and the conductive paste contain the same material.

5. A method for manufacturing a photoelectric conversion element module, comprising:

a preparation step of preparing a plurality of photoelectric conversion elements each having a first electrode plate, a second electrode plate, a sealing member, and an electrolyte; the first electrode plate and the second electrode plate oppose each other, the electrolyte is arranged between the first electrode plate and the second electrode plate, and the sealing member is connected to the first electrode plate and the second electrode plate, the sealing member encompassing the electrolyte between the first electrode plate and the second electrode plate, the plurality of photoelectric conversion elements being prepared so as to be arranged in planar form such that directions from the first electrodes plates toward the second electrodes plates are the same; and a connection step of electrically connecting the plurality of photoelectric conversion elements to each other by a conductive member, wherein the first electrode plates and the second electrode plates each have a portion which, when viewing the first electrode plate and the second electrode plate along a direction connecting the first electrode plate and the second electrode plate, extends to outside a region encompassed by an outer periphery of the sealing member, in the connection step, in adjacent photoelectric conversion elements, the extended portion of the first electrode plate of one of the photoelectric conversion elements is connected with the extended portion of the second electrode plate of the other photoelectric conversion element by the conductive member, the conducting member being provided between the sealing member of one of the adjacent photoelectric conversion elements and the sealing member of the other photoelectric conversion elements and the conductive member being separated from the sealing members such that the conductive member does not contact the sealing members, and wherein one of the extended portion of the first electrode plate or the extended portion of the second electrode plate has flexibility;

in the connection step, the extended portion of the first electrode plate and the extended portion of the second electrode plate are connected with the conductive member, by applying force to the extended portion having flexibility so as to cause the extended portion of the first electrode plate and the extended portion of the second electrode plate to approach each other.

* * * * *